(12) United States Patent
Sasaki

(10) Patent No.: US 10,782,807 B2
(45) Date of Patent: Sep. 22, 2020

(54) DISPLAY DEVICE

(71) Applicant: Japan Display Inc., Minato-ku (JP)

(72) Inventor: Tohru Sasaki, Minato-ku (JP)

(73) Assignee: Japan Display Inc., Minato-ku (JP)

(*) Notice: Subject to any disclaimer, the term of this patent is extended or adjusted under 35 U.S.C. 154(b) by 116 days.

(21) Appl. No.: 15/860,812

(22) Filed: Jan. 3, 2018

(65) Prior Publication Data

US 2018/0210590 A1    Jul. 26, 2018

(30) Foreign Application Priority Data

Jan. 25, 2017   (JP) ................. 2017-011182

(51) Int. Cl.
| | |
|---|---|
| *G06F 3/041* | (2006.01) |
| *H01L 41/193* | (2006.01) |
| *H01L 41/09* | (2006.01) |
| *H01L 27/32* | (2006.01) |
| *G02F 1/1333* | (2006.01) |
| *H01L 51/52* | (2006.01) |
| *G02F 1/1343* | (2006.01) |

(52) U.S. Cl.
CPC ............ *G06F 3/0412* (2013.01); *G06F 3/041* (2013.01); *G06F 3/0416* (2013.01); *H01L 27/323* (2013.01); *H01L 41/0926* (2013.01); *H01L 41/193* (2013.01); *G02F 1/1343* (2013.01); *G02F 1/13338* (2013.01); *G02F 1/133305* (2013.01); *G06F 2203/04102* (2013.01); *H01L 51/5203* (2013.01); *H01L 2251/5338* (2013.01)

(58) Field of Classification Search
CPC .................... G06F 3/0412; G02F 1/1343
See application file for complete search history.

(56) References Cited

U.S. PATENT DOCUMENTS

| | | | | |
|---|---|---|---|---|
| 4,363,993 A | * | 12/1982 | Nishigaki | G11B 5/592 |
| | | | | 310/332 |
| 4,904,894 A | * | 2/1990 | Henry | G01W 1/14 |
| | | | | 310/324 |
| 9,477,306 B1 | * | 10/2016 | Hebenstreit | G09B 21/003 |
| 2007/0120444 A1 | * | 5/2007 | Kato | F03G 7/06 |
| | | | | 310/330 |
| 2007/0188649 A1 | * | 8/2007 | Hagihara | G03B 17/02 |
| | | | | 348/335 |

(Continued)

FOREIGN PATENT DOCUMENTS

| | | | |
|---|---|---|---|
| JP | 2005192892 A | * | 7/2005 |
| JP | 2013-250710 | | 12/2013 |
| KR | 20140143236 A | * | 12/2014 |

*Primary Examiner* — Nitin Patel
*Assistant Examiner* — Robert M Stone
(74) *Attorney, Agent, or Firm* — Oblon, McClelland, Maier & Neustadt, L.L.P.

(57) ABSTRACT

The purpose of the present invention is to realize a flexible display device with a touch sensor that flexibility is maintained in a normal operation as a display; however, rigidity is added to the display device when the touch sensor is used. The representative structure of the invention is, a display device comprising: a touch sensor and a display panel, wherein a laminated body of a first actuator and a second actuator is adhered to the rear surface of the display panel, the first actuator itself can bend when voltage is applied, the second actuator itself can bend when voltage is applied.

17 Claims, 18 Drawing Sheets

(56) References Cited

U.S. PATENT DOCUMENTS

| | | | | |
|---|---|---|---|---|
| 2008/0261057 | A1* | 10/2008 | Slobodin | G02F 1/133308 428/447 |
| 2008/0303782 | A1* | 12/2008 | Grant | G06F 1/1615 345/156 |
| 2009/0284485 | A1* | 11/2009 | Colgate | G06F 3/016 345/173 |
| 2009/0322496 | A1* | 12/2009 | da Costa | G06F 3/016 340/407.2 |
| 2010/0079032 | A1* | 4/2010 | Suzuki | H04N 5/23212 310/317 |
| 2011/0115340 | A1* | 5/2011 | Lee | G06F 3/016 310/348 |
| 2012/0038815 | A1* | 2/2012 | Kato | H01L 41/0946 348/340 |
| 2013/0140956 | A1* | 6/2013 | Mitani | B06B 1/0618 310/334 |
| 2013/0215066 | A1* | 8/2013 | Fertl | G04G 9/0064 345/173 |
| 2013/0222126 | A1* | 8/2013 | Aono | G06F 3/041 340/407.2 |
| 2013/0285041 | A1* | 10/2013 | Suematsu | H01L 51/5234 257/40 |
| 2014/0055394 | A1* | 2/2014 | Park | H01L 41/0825 345/173 |
| 2014/0267166 | A1* | 9/2014 | Griffiths | G06F 3/0416 345/175 |
| 2014/0319968 | A1* | 10/2014 | Sashida | H01L 41/083 310/332 |
| 2014/0320396 | A1* | 10/2014 | Modarres | G06F 3/0414 345/156 |
| 2014/0320988 | A1* | 10/2014 | Nagai | H01L 41/22 359/824 |
| 2015/0084902 | A1* | 3/2015 | Atsumi | G06F 1/1626 345/173 |
| 2015/0325779 | A1* | 11/2015 | Fukuda | H01L 41/193 310/367 |
| 2015/0346881 | A1* | 12/2015 | Watazu | G01L 1/16 345/174 |
| 2016/0126450 | A1* | 5/2016 | Rodegheri | H01L 41/25 310/330 |
| 2016/0195971 | A1* | 7/2016 | Ando | G06F 3/044 345/174 |
| 2016/0246440 | A1* | 8/2016 | Ardakani | G06F 3/0416 |
| 2016/0306481 | A1* | 10/2016 | Filiz | G01L 1/16 |

* cited by examiner

FIG. 9
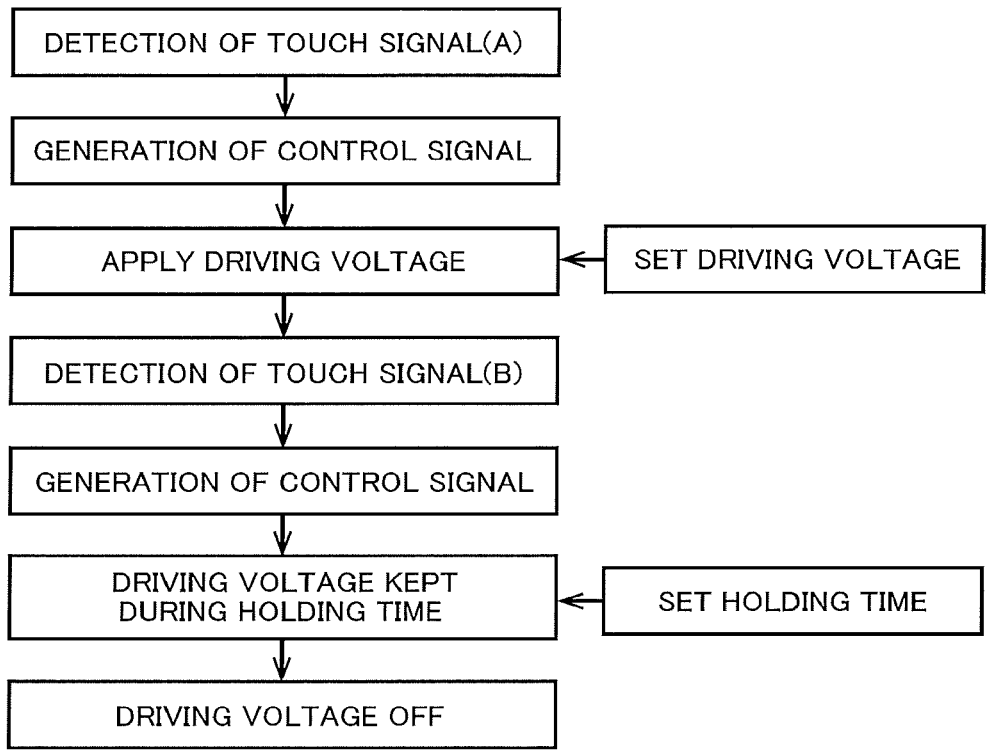
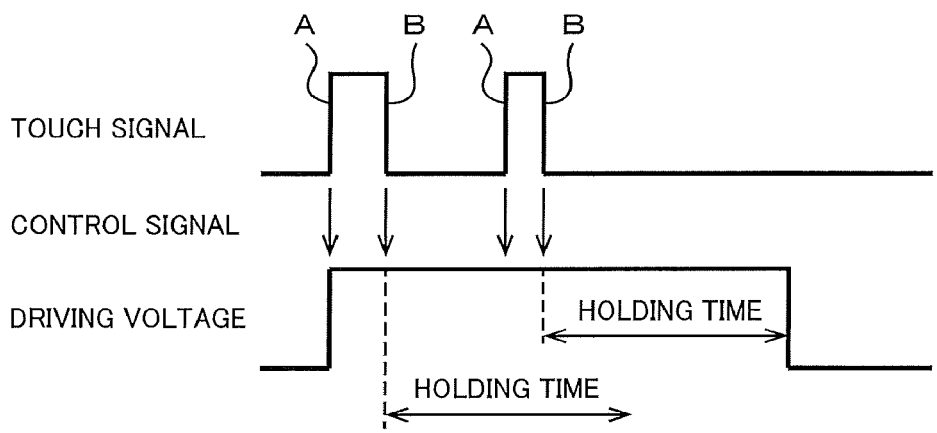

DISPLAY DEVICE

CLAIM OF PRIORITY

The present application claims priority from Japanese Patent Application JP 2017-011182 filed on Jan. 25, 2017, the content of which is hereby incorporated by reference into this application.

BACKGROUND OF THE INVENTION

(1) Field of the Invention

The present invention relates to a flexible display device that can be rigid when needed.

(2) Description of the Related Art

The display device like the organic EL display or the liquid crystal display device can be used in bent state by forming the substrate by flexible resin. Especially, a degree of curvature of the organic EL display can be big since it doesn't need a back light. Herein after, when a radius curvature is R, a degree of curvature is 1/R. The liquid crystal display device, too, can be made a flexible display device by using a sheet like back light formed by e.g. an organic EL lighting sheet.

On the other hand, the electrical actuator that can be bendable according to electrical signals is developed. Among several actuators, the polymer actuator can be driven by 5 V or less. The patent document 1 (Japanese patent laid open No. 2013-250710) discloses that: when a finger touches the home position of a software key board, which is a key board displayed on a screen, a specific vibration pattern is generated by an actuator, thus, the user is notified that his finger touched the home position.

SUMMARY OF THE INVENTION

A flexible display device with a touch sensor can be formed by attaching the flexible touch sensor on a screen side of the flexible display device. This kind of the display has a problem that the display is deformed when a user touches the touch sensor; consequently, the user cannot touch the correct position, thus, detected coordinates are deviated from the intended position. However, if the display device is made thicker or a support plate is attached to the display device to suppress the deformation, a flexibility of the display device is deteriorated.

The purpose of the present invention is that: in a flexible display device with a touch sensor, flexibility is maintained in a normal operation as a display; however, rigidity is added to the display device when the touch sensor is used; thus to improve operability of the touch sensor in the display device.

The present invention solves the above problem. Representative measures are as follows:

(1) A display device comprising: a touch sensor and a display panel wherein a laminated body of a first actuator and a second actuator is adhered to the rear surface of the display panel, the first actuator itself can bend when voltage is applied, the second actuator itself can bend when voltage is applied.

(2) The display device according to (1); wherein a bending direction of the first actuator when voltage is applied and a bending direction of the second actuator when voltage is applied are opposite directions to each other.

(3) The display device according to (1), wherein the voltage is applied to the first actuator and the second actuator during an operation of the touch sensor.

BRIEF DESCRIPTION OF THE DRAWINGS

FIG. 9 is the block diagram and the timing chart to show the function of the present invention;
FIG. 10 is a plan view when the actuator is formed frame like;
FIG. 11 is a plan view when the actuator is formed window like;
FIG. 12 is a plan view when the actuator is formed frame and cross like.

DETAILED DESCRIPTION OF THE PREFERRED EMBODIMENTS

The summary of the present invention is to set a polymer actuator at the reverse side of the screen of the display device wherein rigidity is added when the user touches the touch sensor, however, in a normal state, the display device maintains flexibility. The present invention will be described in detail referring to the following embodiments. In the following embodiments, the invention is explained mainly in an example that the display is an organic EL display device; however, the present invention is applicable to other flexible display device like a liquid crystal display device or an electronic paper, etc.

First Embodiment

Figure 1:
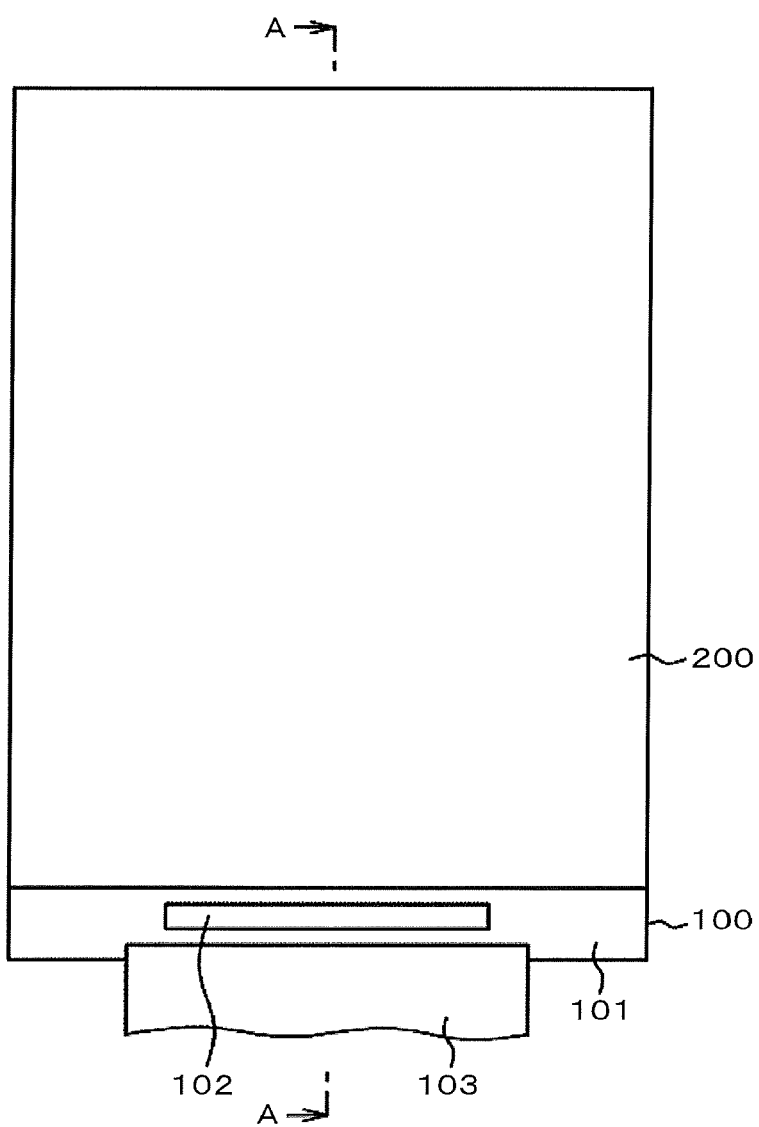
FIG. 1 is a plan view of the display device according to the present invention.

FIG. 1 is a plan view of the display device according to the present invention. The present invention is applicable to flexible displays of organic EL display devices, etc. In FIG. 1, the touch sensor 200 is attached on the display panel 100, where display elements and TFTs (Thin Film Transistor) are formed. The touch sensor 200 is attached on the display area of the display panel 100. In FIG. 1, notation 101 is a lower frame portion of the display panel 100 where the driver IC 102 that drives the display device is installed, and the flexible wiring substrate 103 that supplies powers or signals to the display device is connected to the terminals (not depicted in FIG. 1) formed on the lower frame portion 101. The wirings formed in the flexible wiring substrate 103 can be formed directly in the lower frame portion 101 of the display device 100. The polymer actuator, which is not described in FIG. 1, is attached on the back surface of the display panel 100.

Figure 2:
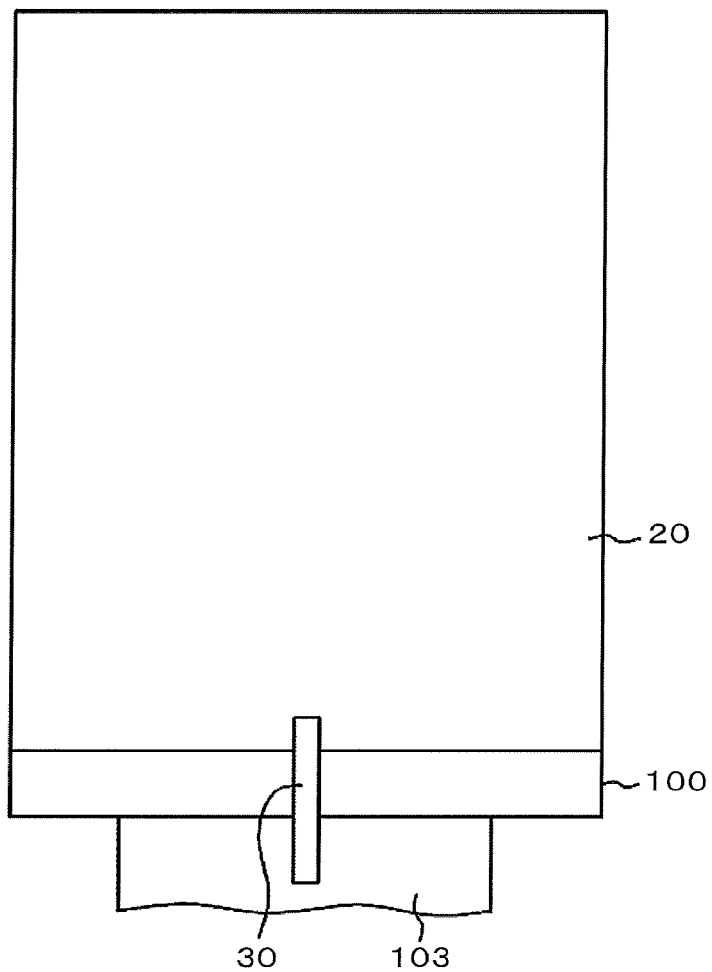
FIG. 2 is a rear view of FIG. 1.

FIG. 2 is a rear view of FIG. 1. In FIG. 2, the actuator is attached on the back surface of the display panel 100. The actuator is a laminated body of the first actuator 10 and the second actuator 20, however, in FIG. 2, only the second actuator 20 is seen. The conductive tape 30 is connected to the second actuator 20 to supply power; the conductive tape 30 connects with the flexible wiring substrate 103 that is connected to the display panel 100.

Figure 3:
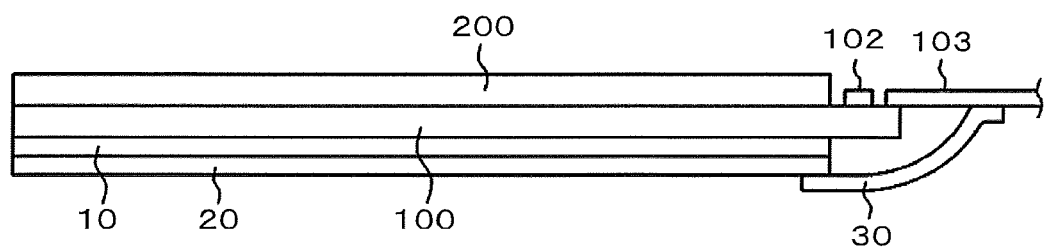
FIG. 3 is cross sectional view along the line A-A of FIG. 1.

FIG. 3 is cross sectional view along the line A-A of FIG. 1. In FIG. 3, the touch sensor 200 is adhered to the screen side of the display panel 100; a laminated body of the first actuator 10 and the second actuator 20 is attached to the rear surface of the display panel 100. In FIG. 3, the conductive tape 30 is connected only to the second actuator 20; however, in the actual device, the conductive tape 30 is connected to the first actuator 10, too.

The display panel 100 is a flexible display panel which the substrate is formed by resin, like e.g. polyimide of thickness of approximately 10 µm to 20 µm. The touch sensor 200 is also flexible since the substrate of the touch sensor 200 is made of thin resin, like e.g. polyimide. In FIG. 3, the touch sensor 200 is an independent body which is attached to the display panel 100; however, the touch sensor 200 can be built in in the display panel 100.

Consequently, the display device with a touch sensor 200 has a structure that can be flexibly bent. The flexible display device has several advantages; however, it has a problem when the touch sensor 200 is used in that: when the user touches the touch sensor 200, the display device is bent or deformed, consequently the touch position and the detected coordinates deviate.

If the thickness of the touch sensor 200 or display panel 100 is increased, or a support plate is attached to the display device, the flexibility of the display is deteriorated. The feature of the present invention is to attach two actuators on the back surface of the flexible display panel to give rigidity to the display device when the touch sensor is operated; in the meantime the flexibility of the display device is maintained during a normal operation; thus, to improve the usability of the flexible display device with a touch sensor.

In FIG. 3, a thin touch sensor 200 can be used to keep flexibility of the display device as a whole. If the touch sensor 200 is built in in the display panel 100, influence of the touch sensor 100 to the flexibility of the display device doesn't occur. Although it depends on the structure, the actuator can maintain flexibility if the thickness is as thin as approximately 20 µm. The feature of the present invention is to attach the laminated film of two flexible actuators to the back surface of the flexible display panel 100; thus, to give rigidity when the touch sensor 200 is used, while flexibility of the display device is maintained in normal state. In the meantime, other components as e.g. of a polarizing plate can be attached on the display panel 100.

Figure 4:
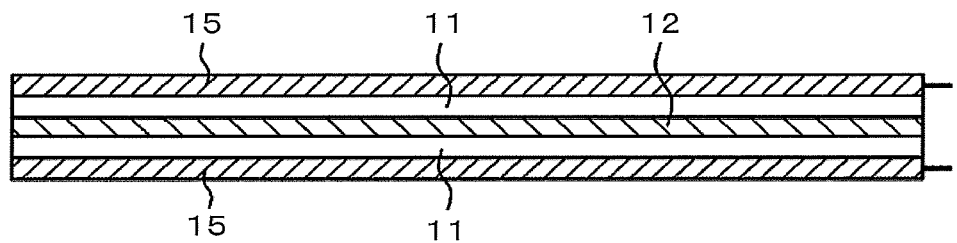
FIG. 4 is a cross sectional view of the actuator.

FIG. 4 is a cross sectional view of the actuator. In FIG. 4, the conductive polymer films 11 sandwich the ion exchange resin 12, wherein the electrodes 15 are laminated on the surfaces of the conductive polymer films 11. The function of the actuator of FIG. 4 can be explained conceptually for simplification as follows. When DC voltage is applied between the two electrodes 15, ions move to one of the two conductive polymer films 11 through the ion exchange resin 12; then the conductive polymer film 11 that ions are injected extends. On the contrary, the conductive polymer that ions are removed shrinks. Thus, the actuator can be bent to the intended direction.

Figure 5:
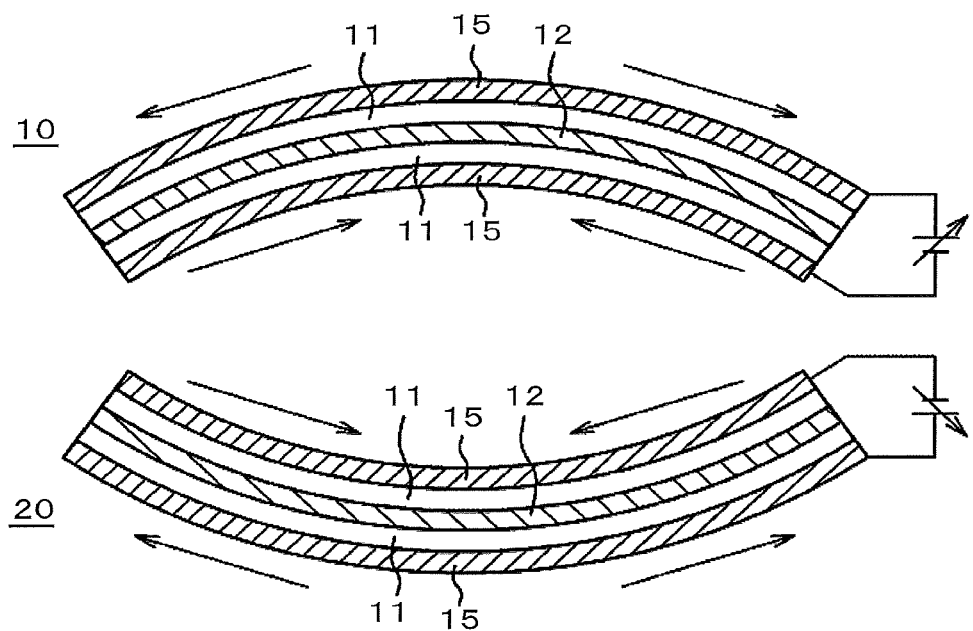
FIG. 5 is a cross sectional view that shows the concept of the present invention.

FIG. 5 is a cross sectional view that shows the concept of the present invention using the above explained function. The upper part of FIG. 5 is the first actuator 10. Plus voltage is applied to the upper electrode 15 in the first actuator 10. If ions moving in the ion exchange resin 12 are minus, the ions are gathered in upper electrode 15, thus, the upper conductive polymer film 11 extends; consequently, the first actuator 10 bends convex in the upper side.

The lower part of FIG. 5 is the second actuator 20. Plus voltage is applied to the lower electrode 15 of the second actuator 20. If ions moving in the ion exchange resin 12 are minus, the ions are gathered in lower electrode 15, thus, the lower conductive polymer film 11 extends; consequently, the second actuator 10 bends convex in the lower side.

Figure 6:
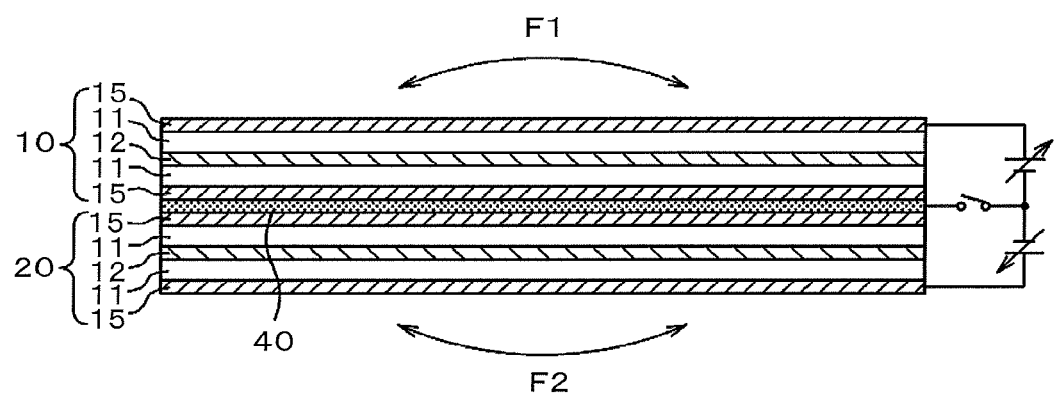
FIG. 6 is a cross sectional view that the first actuator and the second actuator of FIG. 5 are adhered to each other by the adhesive.

FIG. 6 is a cross sectional view that depicts the first actuator 10 and the second actuator 20 of FIG. 5 are adhered to each other by the adhesive 40. The direction of the voltage is depicted in FIG. 6, which is the same as in FIG. 5. In FIG. 6, the first actuator 10 of upper side tends to bend convex to the upper side as shown F1. On the other hand, the second actuator 20 of lower side tends to bend convex to the lower side as shown F2. The directions of bending between the first actuator and the second actuator are reversed to each other, thus, the both actuators cannot bend, consequently, flatness is maintained as a total; however, due to the existence of F1 and F2, the laminated film of the first actuator 10 and the second actuator 20 is rigid.

On the other hand, if the voltage is not applied, actuators as a total is flexible since both of the first actuator and the second actuator are thin films. Therefore, when e.g. the touch sensor operation is necessary, the voltages can be applied to the first actuator and the second actuator to make the laminated film rigid; consequently, the display device with the touch sensor 200, which the laminated film of actuators 10, 20 is attached, is made rigid. Thus, the operability of the touch sensor 200 is improved or a precise touch operation becomes possible.

In FIG. 6, a thickness of each of the first actuator 10 and the second actuator 20 can be made as thin as 20 µm. The thickness of the adhesive can be made as 10 µm to 30 µm.

Thus, flexibility can be maintained in a normal state. Further, the voltage for each of the actuators can be 5 V or less, thus, the power source for the display device can be commonly used for the display panel and the actuators.

As for the adhesive 40, resin of epoxy based, acrylic based or silicone based can be used; and the adhesive can be Ultra Violet set resin (UV set resin) or thermoset resin. In this case, the adhesive 40 is preferably electrical conductive resin. Using conductive adhesive 40, the voltage can be applied commonly to the opposing electrodes 15 of the first actuator 10 and the second actuator 20. The conductive adhesive 40 is made as that: metal particles of Ni, Cu, Ag, Al, etc., or carbon particles as e.g. graphite are dispersed in the resin of the conductive adhesive 40.

The pressure sensitive adhesive can be used as the adhesive 40. The pressure sensitive adhesive can be made conductive as that: metal particles of Ni, Cu, Ag, Al, etc., or carbon particles as e.g. graphite are dispersed in the resin of the pressure sensitive adhesive. Further, conductive particles can be resin particles whose surfaces are coated with metal. The pressure sensitive adhesive 40 is made as a sheet to be adhered to the first actuator 10 or the second actuator 20.

In FIG. 6, the bending directions of the first actuator 10 and the second actuator 20 are opposite at the edges. In this structure, the edges of the first actuator 10 and the second actuator 20 have a force to adhere to each other at the edge, thus, peeling off between the two actuators is not likely to occur.

Figure 7:
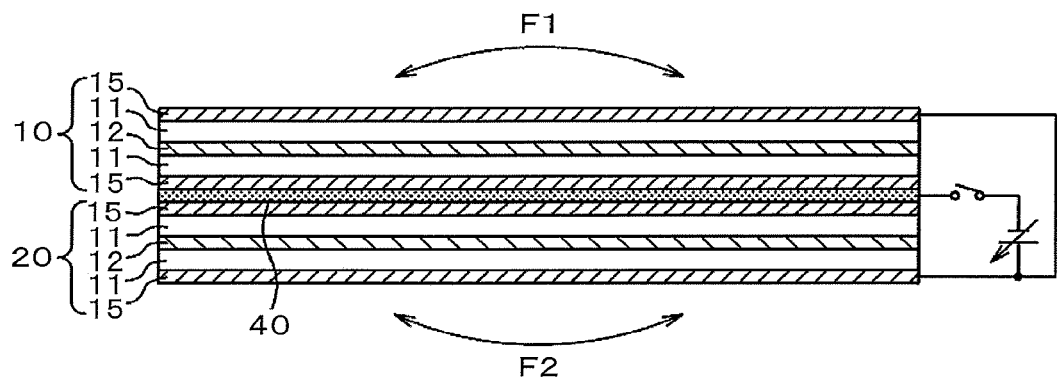
FIG. 7 is a different method to apply voltages to the first actuator and the second actuator.

FIG. 7 is the structure that shows a different method of voltage applications to the first actuator 10 and the second actuator 20. In FIG. 7, the common voltage is applied to the outer electrodes 15 of both of the first actuator 10 and the second actuator 20; therefore, only one power source is necessary, thus, structure is simplified. On the other hand, two power sources are necessary in FIG. 6, however, it has a merit when the characteristics of the first actuator 10 and the second actuator 20 are different, since voltages to the first actuator 10 and the second actuator 20 can be independently controlled to maintain flatness of the laminated actuator.

Figure 8:
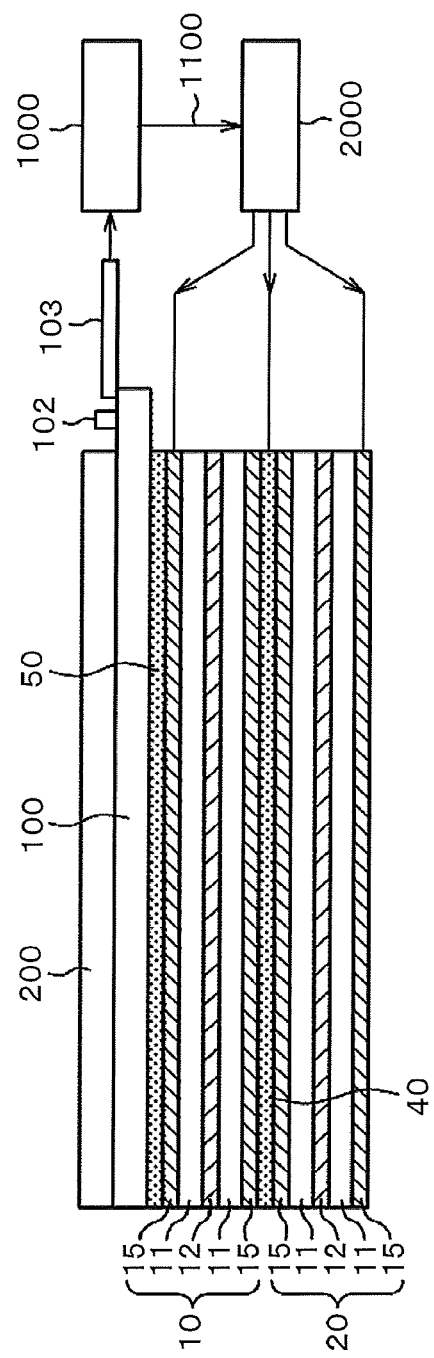
FIG. 8 is a cross sectional view according to the present invention.

FIG. 8 is a cross sectional view according to the present invention. In FIG. 8, the touch sensor 200 is set on the display panel 100; the driver IC 102 is set on the frame of the display device 100 and the flexible wiring substrate 103 is connected to the frame of the display panel 100. The first actuator 10 is adhered on the back surface of the display panel 100 by the adhesive 50; the second actuator 20 is adhered to the first actuator 10 by the conductive adhesive 40. In FIG. 8, the thicknesses of the actuators are depicted thick to emphasize the structure of the actuators 10, 20; however, in many cases, the thicknesses of the actuators 10, 20 are thinner than that of the display panel 100.

Either one of the UV-set resin or the thermoset resin is applicable as the adhesive 50; further pressure sensitive adhesive is also applicable. In the case that the pressure sensitive adhesive is applied, the following structure can be taken: namely, the adhesive strength between the display panel 100 and the first actuator 10 make weaker than the adhesive strength between the first actuator 10 and the second actuator 20; thus, the laminated body of the actuators 10, 20 can be removed from the display panel 100 when needed.

An independent flexible wiring substrate for the touch sensor 200 can be used; in FIG. 8, however, the flexible wiring substrate 103 connecting to the display panel 100 also works for the input and output to the touch sensor 200. In FIG. 8, when the touch sensor 200 is touched by e.g. a finger, the touch signal is detected by the detecting circuit 1000. The control signal 1100 is sent from the detecting circuit 1000 to the actuator driving circuit 2000; then, the actuator driving circuit 2000 input the driving voltage to the first actuator 10 and the second actuator 20. Consequently, the laminated film of the actuators 10, 20 becomes rigid, thus, operability of the touch sensor 200 is improved.

FIG. 9 is the block diagram and the timing chart to show the explained function. In FIG. 9, when a person touches the touch sensor 200, a touch signal is detected. By the way, the touch means touching by a figure or a pen, etc. When the detecting circuit 1000 detects the rise of the touch signal (A), it generates the control signal 1100. Receiving the control signal 1100, the driving circuit 2000 generates the driving voltage to drive the actuators. The driving voltage can be set externally to the designed value.

The touch signal is maintained in certain time. This time corresponds to the time that a person touches the touch sensor 200. When the touch to the touch sensor 200 ends the touch signal disappears; at this time, the detecting circuit 1000 detects the fall of the touch signal (B); consequently, the detecting circuit 1000 generates the control signal 1100, and sends it to the driving circuit 2000. The driving circuit 2000 keeps the driving voltage during the holding time from the timing B. The holding time can be externally set.

When the new touch signal is detected during the holding time, the driving circuit 2000 continuously supplies the driving voltage to the actuators 10, 20. In FIG. 9, after the first touch signal is detected, the second touch signal is detected during the holding time; therefore, the driving voltage is continuously supplied to the actuator.

In FIG. 9, the same process is performed after the second touch signal is detected. In FIG. 9, another touch signal is not detected after the second touch signal; then, after the second touch signal is detected and the driving voltage is maintained during the holding time, the driving voltage becomes off. Consequently, the actuator loses the rigidity, and the display device becomes flexible again.

The above explained function is the same in other embodiments of the present invention. As described above, the normally flexible display device can be rigid only when the touch sensor operates.

Figure 10:
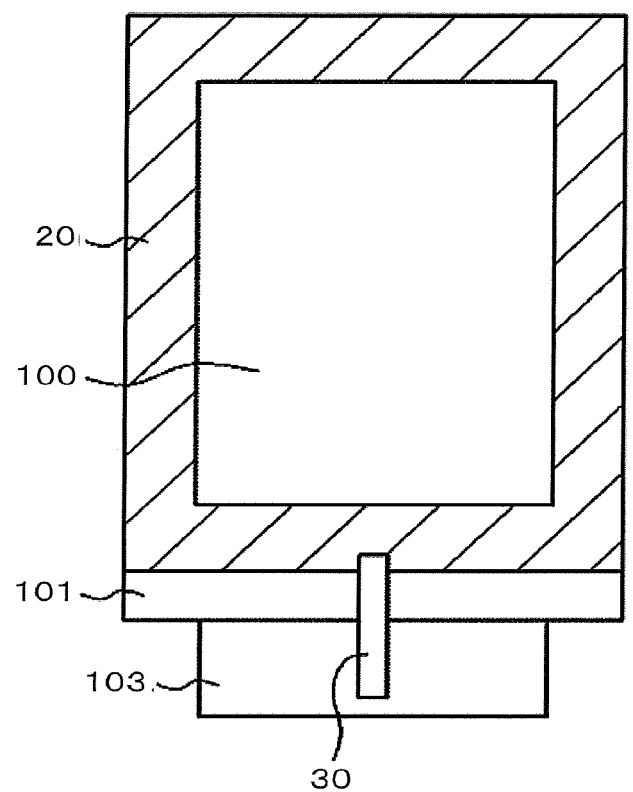
Figure 11:
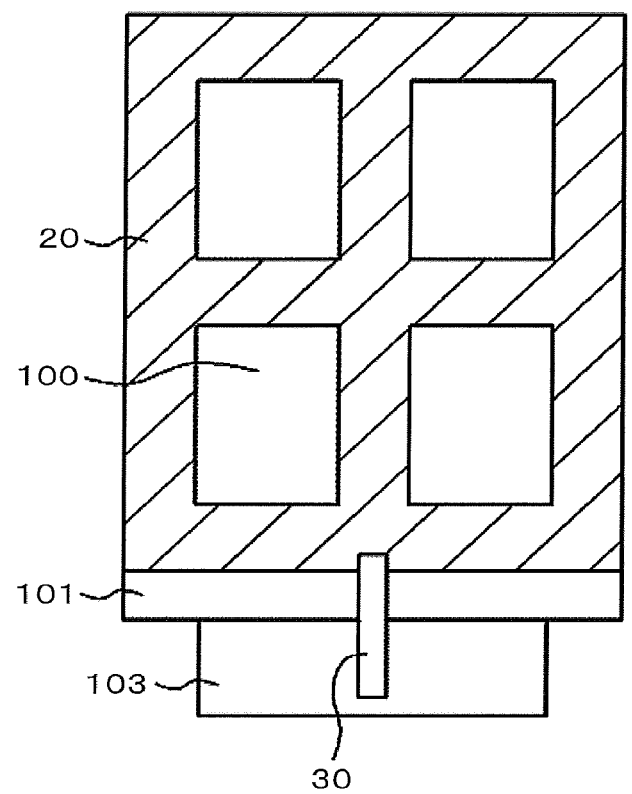
Figure 12:
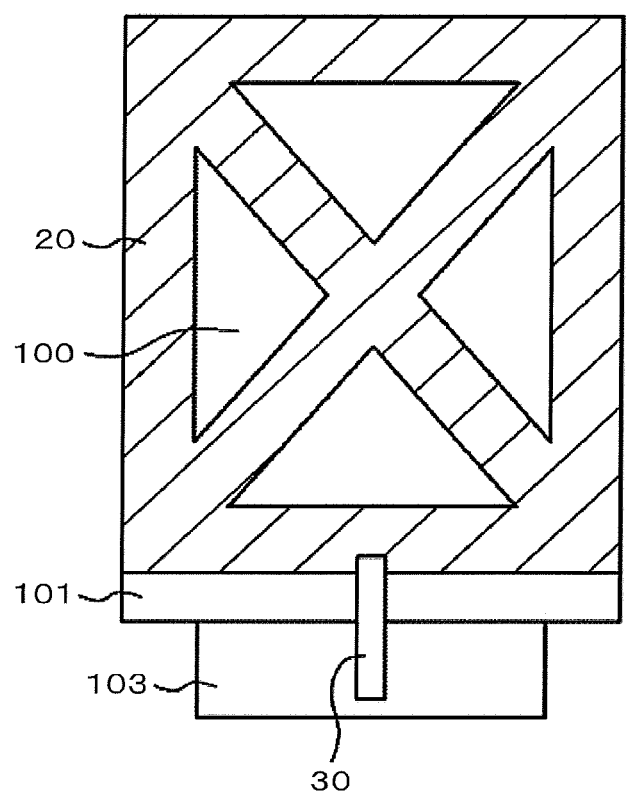

The above embodiment was explained as that the actuator is formed corresponding to all over the display area. The actuator, however, can be formed in various shapes. FIG. 10 is a plan view when the actuator is formed frame like. FIG. 11 is a plan view when the actuator is formed window like. FIG. 12 is a plan view when the actuator is formed frame and cross like.

In all the above cases, the shapes of the first actuator 10 and the second actuator 20 are preferably the same. The influence of the actuators 10, 20 to the flexibility of the display device can be mitigated by making the shape of the actuator like e.g. FIGS. 10 to 12. The above example shows the actuator is set only corresponding to the display area, however, the actuator 10, 20 can be set to the place including to the lower frame area 101 of the display panel 100 when needed.

Figure 13:
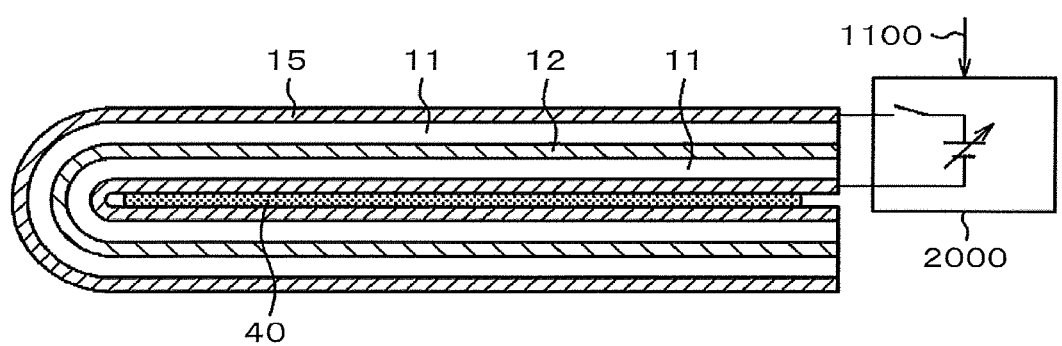
FIG. 13 is a cross sectional view of another structure of the first embodiment of the present invention.

FIG. 13 is a cross sectional view that shows a variation of the present embodiment. The feature of FIG. 13 is that the first actuator 10 and the second actuator 20 are formed by folding one actuator sheet. The actuator is fixed by the adhesive 40 after it is folded. The adhesive is preferably the conductive adhesive 40 as explained in FIG. 6.

In FIG. 13, only one driving power source for the actuator is necessary. In FIG. 13, since only one sheet of the actuator is used, the difference in characteristics between the first actuator 10 and the second actuator 20 are small; thus, bending forces are approximately the same between the first actuator 10 and the second actuator 20, consequently, the flatness of the touch sensor 200 during the touch sensor operation can be satisfied even when the only one power source is used. The cross sectional view and the function when the actuator of FIG. 13 is set to the display panel 100 are the same as explained at FIGS. 8 and 9.

Second Embodiment

Figure 14:
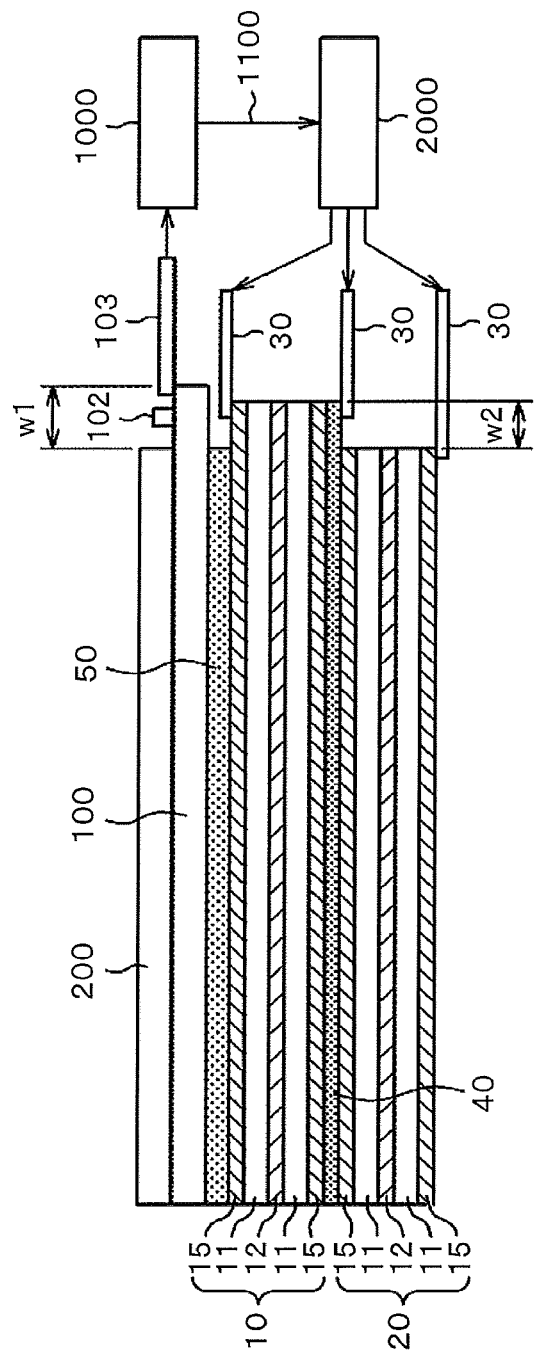
FIG. 14 is a cross sectional view of the second embodiment of the present invention.

The first embodiment explains the essential structure and the function of the present invention. In the actual device, the structure how to supply the voltages to the actuators is a problem. FIG. 14 is a cross sectional view of the second embodiment of the present invention. FIG. 14 differs from FIG. 8 in that the first actuator 10 is made bigger than the second actuator 20 to form the terminal in the first actuator 10. By the way, in FIG. 14, the first actuator 10 is bigger than the second actuator 20, however, on the contrary, the second actuator 20 can be bigger than the first actuator 10 because the purpose is to form the terminal.

In FIG. 14, the first actuator 10 is bigger than the second actuator 20 in width w2. The width w2 is the same or less than the width w1 of the lower frame 101 of the display panel 100. In FIG. 14, notation 30 is a conductive tape to supply the signal (power) to the actuator. Since only one voltage is applied the conductive tape 30, the normal flexible wiring substrate, which has complex wirings, is not necessary.

The conductive tape is e.g. a metal tape of e.g. Al or Cu with the conductive adhesive. The conductive adhesive is that metal particles of e.g. Ni, Cu, Ag, Al or carbon particles of graphite are dispersed in the adhesive of e.g. acrylic. Further, fine particles of resin coated with metal can be used as conductive particles. The conductive tape 30 and the actuator 10, 20 can be electrically connected by attaching the conductive tape 30 directly to the actuator 10, 20.

The thermoset resin can be used for the conductive film for thermo-compression bonding of the conductive tape 30 to the actuator to further improve the reliability of the connection. The conductive particles bridge the conductive tape 30 and the actuator by the thermo-compression bonding.

In FIG. 14, the conductive adhesive 40 formed on the first actuator extends up to the connection area for the conductive tape 30. Thus, the electrode 15 of the first actuator 10 can be protected by the conductive adhesive 40. On the other hand, the outer electrodes of the first actuator 10 and the second actuator 20 should preferably get some protections. The details are explained below.

Figure 15:
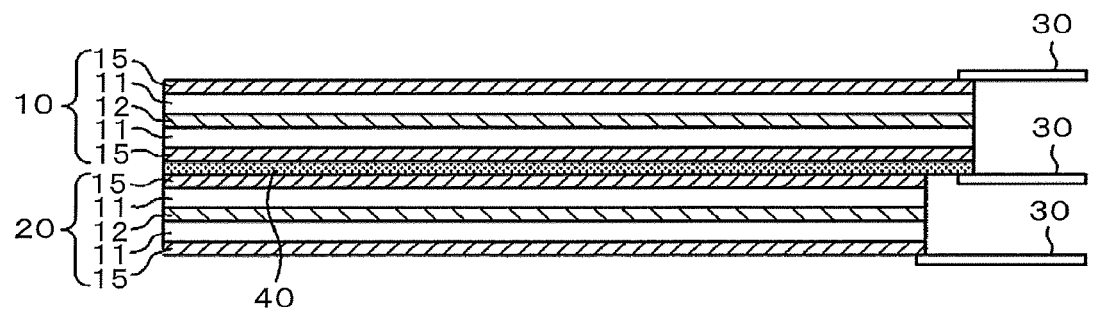
FIG. 15 is a cross sectional view of the laminated structure of the actuators.
Figure 16:
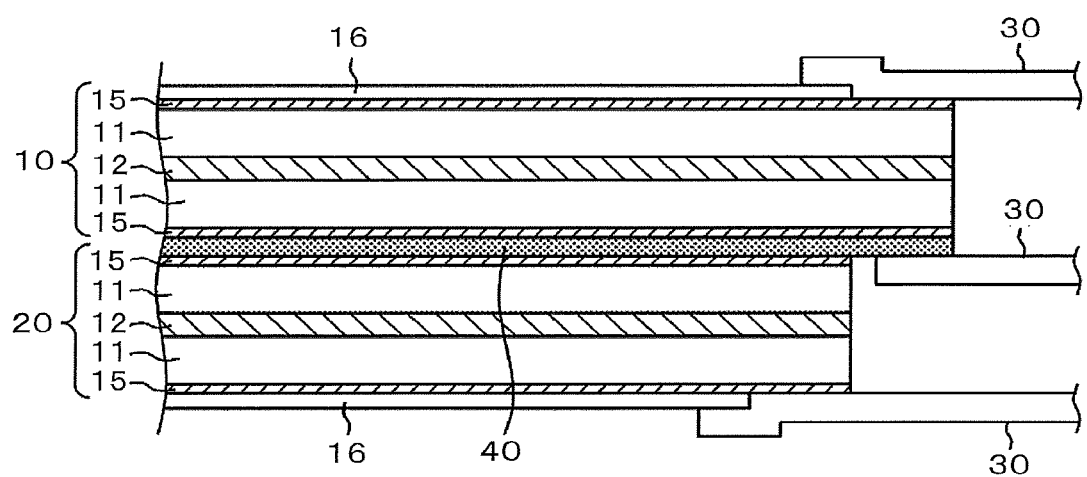
FIG. 16 is a detailed cross sectional view of the actuator of FIG. 15 at the vicinity of the terminals.

FIG. 15 is a cross sectional view of the laminated structure of the actuators 10, 20. FIG. 14 is the structure that the lamination of the actuators 10, 20 of FIG. 15 is attached to the display panel 100. FIG. 16 is a detailed cross sectional view of the actuator 10, 20 of FIG. 15 at the vicinity of the terminals. The basic structure is the same as already explained at e.g. FIGS. 4 and 8.

In FIG. 16, the protective film 16 is formed covering the electrodes 15 of the first actuator 10 and the second actuator 20. Metals of Cu, Ag, Au, Ni, Ti, Mo, W or alloys of those metals are used for the electrode 15. If the electrode 15 is made of a thin metal, mechanical or chemical protection is necessary. As to the protective film 16, inorganic film of e.g. SiO or SiN, or organic film of e.g. polyimide, acrylic, epoxy can be used. The inorganic protective film is superior in protection against moisture; however, there is a possibility that it is cracked when the display device is bent since the flexible display device is generally subject to be bent. In this point, the organic protective film has an advantage. The best protective film is a laminated film of the inorganic film over coated by the organic film.

Figure 17:
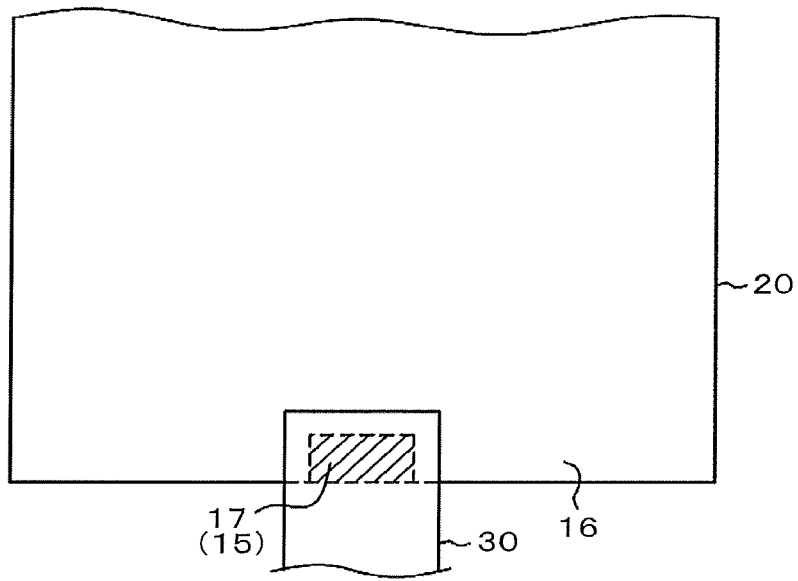
FIG. 17 is a plan view at the vicinity of the lower terminal of the second actuator.

FIG. 17 is a plan view at the vicinity of the lower terminal 17 of the second actuator 20. In FIG. 17, the electrode 15 is covered by the protective film 16 except the terminal 17, which is the hatching area. The conductive tape 30 adheres to cover the terminal 17. The conductive tape 30 can contain either the pressure sensitive conductive adhesive or the thermosetting conductive resin which is subject to thermo-compression bonding.

Figure 18:
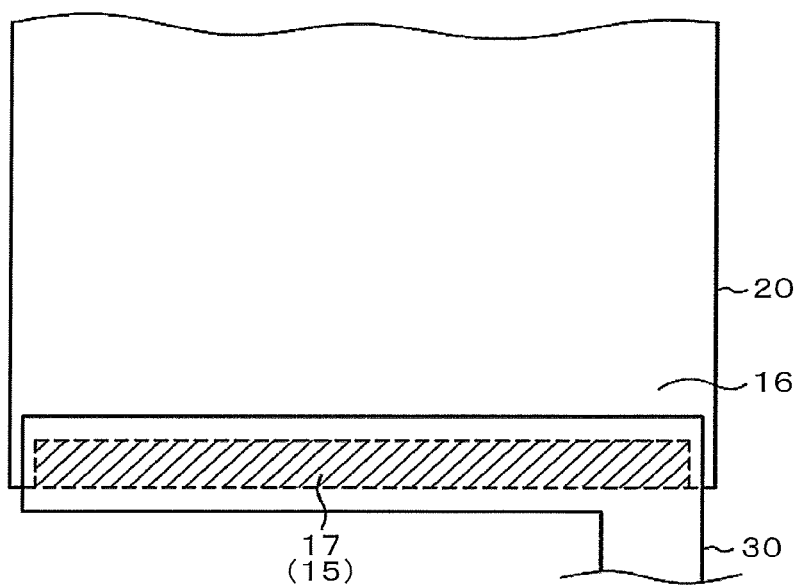
FIG. 18 is a plan view that the terminal is formed along the side of the second actuator.
Figure 19:
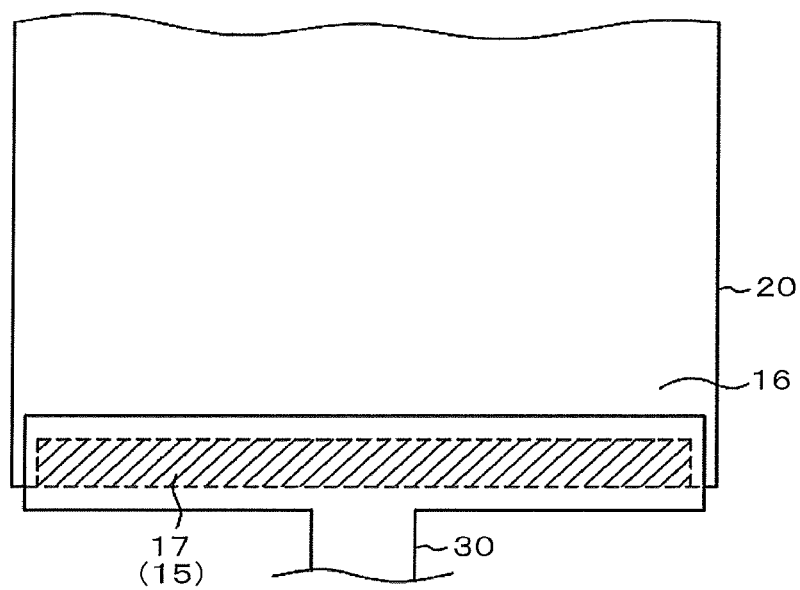
FIG. 19 is a plan view of another example that the terminal is formed along the side of the second actuator.

FIG. 18 is a plan view that the terminal 17, which is hatching area, is formed along the side of the second actuator 20. The conductive tape 30 is L shaped in a plan view. According to the structure of FIG. 18, the driving current can flow uniformly in the electrode 15 even when the electrical resistance of the electrode 15 is large due to e.g. thin thickness of the electrode 15. FIG. 19 is a plan view of another example that the terminal 17, which is hatching area, is formed along the side of the second actuator 20. The conductive tape is T shaped in a plan view. The effect of the structure of FIG. 19 is the same as to the structure of FIG. 18.

Figure 20:
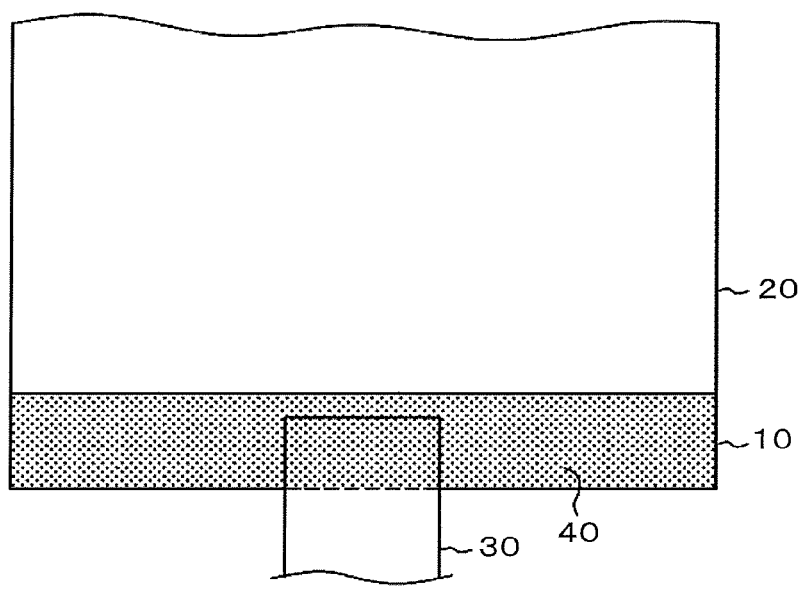
FIG. 20 is a plan view of yet another example of the structure of the terminal.

Back to FIG. 16, the lower electrode 15 of the first actuator 10 is covered by the conductive adhesive 40 up to the area of lower frame area, thus, it is not necessary to cover the lower electrode 15 by the protective film. FIG. 20 is a plan view of this area. In FIG. 20, the area corresponding to the lower frame area is covered by the conductive adhesive 40. The conductive tape 30 directly adheres to the conductive adhesive 40. In this case, too, the conductive tape 30 can contain either the pressure sensitive conductive adhesive or thermosetting conductive resin which is subject to thermo-compression bonding.

Figure 21:
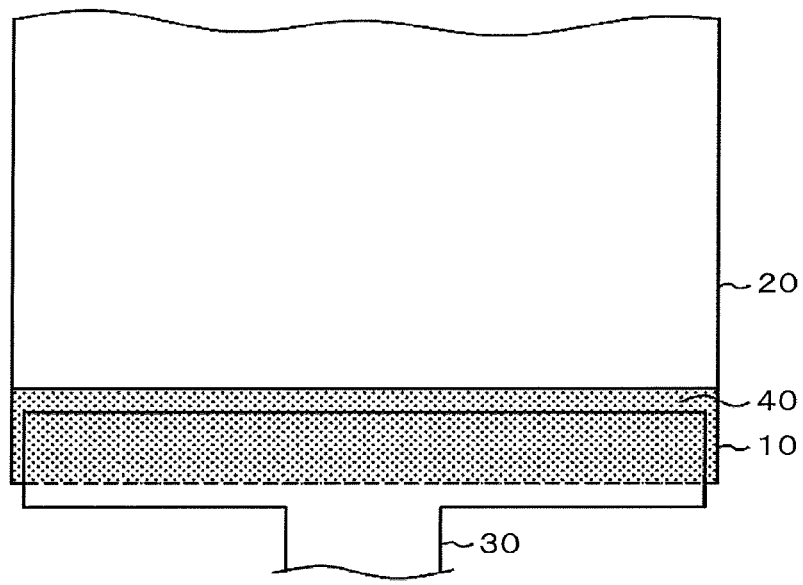
FIG. 21 is a plan view of yet another example of the structure of the terminal.

FIG. 21 is an example that a plan view of the conductive tape 30 is T shaped. In the structure of FIG. 21, the driving current can flow uniformly even when the electrical resistance of the electrode 15 is large due to e.g. thin thickness of the electrode 15. The conductive tape is not restricted to T shape but other shapes like L shape as described in FIG. 18 are applicable.

In the above explained structure, the electrode 15 uses metals. In this case, the protective film 16 is necessary to protect metals chemically and mechanically. On the other hand, the electrode 15 can be made of conductive resin. The conductive resin is that metal particles of e.g. Ni, Cu, Ag, Al or carbon particles of graphite are dispersed in the resin. Further fine particles of resin coated with metal can be used as conductive particles.

As to the resin, epoxy, acrylic, silicone, etc. are applicable. In the resin, which is liquid before curing, conductive particles are dispersed, subsequently, the resin is coated by screen printing. After that, the printed layer is cured; thus, the electrode is completed. Such a resin is stable mechanically and chemically, therefore, the protective film is not necessary. Therefore, the conductive tape 30 is directly connected to the electrode 15 as explained at FIGS. 20 and 21.

Third Embodiment

The structures of the first embodiment and the second embodiment are that the first actuator 10 and the second actuator 20 are formed separately; subsequently, they are adhered to each other by e.g. conductive adhesive 40. On the other hand, if the actuator is formed by a thin film technology or by print technology, layers can be formed continuously for the first actuator 10 and the second actuator 20. Therefore, in this structure, the process for assembling the first actuator 10 and the second actuator 20 is not necessary.

Figure 22:
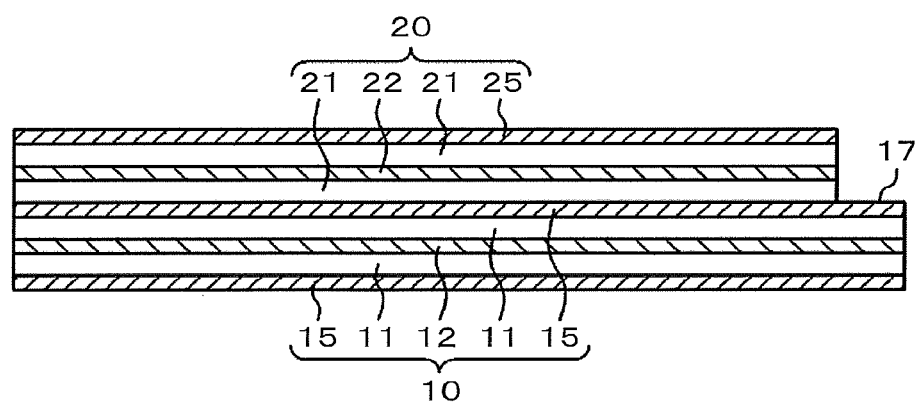
FIG. 22 is a cross sectional view of the actuator according to the third embodiment.

FIG. 22 is a cross sectional view of the actuator according to the third embodiment. In FIG. 22, too, there exist the first actuator 10 and the second actuator 20. The structure of FIG. 22 features that the upper electrode 15 of the first actuator and the lower electrode 15 of the second actuator are common. The structure of each of the actuators is the same as explained at FIG. 4.

In FIG. 22, the electrode 15, the conductive polymer 11, the ion exchange resin 12, the conductive polymer 11 and the electrode 15 are formed in this order; consequently, the first actuator is formed. Subsequently, the conductive polymer 21, the ion exchange resin 22, the conductive polymer 21, and the electrode 25 are continuously formed to make the second actuator 20. The upper electrode 15 of the first actuator 10 and the lower electrode 15 of the second actuator 20 are common. After that, the edge portion of the second actuator is truncated to form the lower frame portion 17 in the first actuator 10. The function of the present embodiment is the same as explained in the first embodiment.

Another method to realize the structure of FIG. 22 is as follows. The first actuator 10 is formed without the upper electrode 15; the second actuator 20 is formed without the lower electrode 15. Subsequently, the conductive resin is formed by e.g. screen print at the position where either the upper electrode 15 of the first actuator 10 or the lower electrode 25 of the second actuator 20 is to be formed. After that, the first actuator 10 and the second actuator 20 are adhered to each other.

Fourth Embodiment

Figure 23:
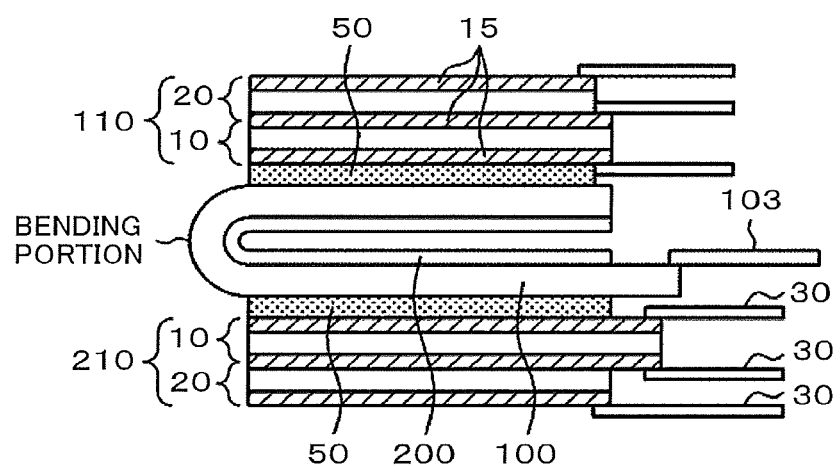
FIG. 23 is a cross sectional view of the display device according to the fourth embodiment.

The fourth embodiment is that the present invention is applied to the flexible display device for specific application. There is an application of the flexible display device that it is folded usually to save the space and unfolded like a book when it is used. FIG. 23 is cross sectional view of this kind of the flexible display device.

In FIG. 23, the display device comprising the touch sensor 200 and the flexible display panel 100 is folded in half. On the back of the display panel 100, the first actuator set 110 comprising the first actuator 10 and the second actuator 20, and the second actuator set 210 comprising the first actuator 10 and the second actuator 20 are separately adhered by the adhesive 50. The adhesive 50 is the same as explained at FIG. 6.

In FIG. 23, there is no actuator at the bending portion, thus bending stress is not built in the actuator. Therefore, this structure is used even when the actuator is weak to the bending stress. The actuator of FIG. 23 is the same as the actuator of the third embodiment; however, the actuator can be the same as the first embodiment.

Figure 24:
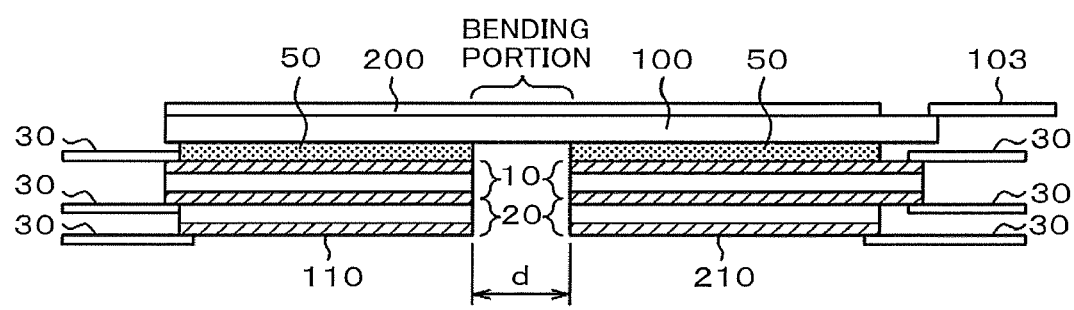
FIG. 24 is a cross sectional view that the flexible display device of the fourth embodiment is in unfolded state.

FIG. 24 is a cross sectional view that the flexible display device is used in unfolded state. In FIG. 24, the first actuator set 110 is attached at the left of the display panel 100 and the second actuator set 210 is attached at the right of the display panel 100. When the flexile display device is to be used as the book or the touch sensor function is to be used, rigidity is added to the display device by making the two actuator sets work.

In FIG. 24, there is a distance d between the first actuator set 110 and the second actuator set 210; however, the distance of d is not big, it doesn't affect a normal work. If the purpose is to avoid the actuator from bending stress when the display panel is bent, the preferable space d depends on the thickness of the display device. For example, if the thickness of the display device is 0.5 mm, the space w can be: $\pi \times (0.5$ mm$+0.5$ mm$)=3.14$ mm. Therefore, d can be 4 mm or less.

Figure 25:
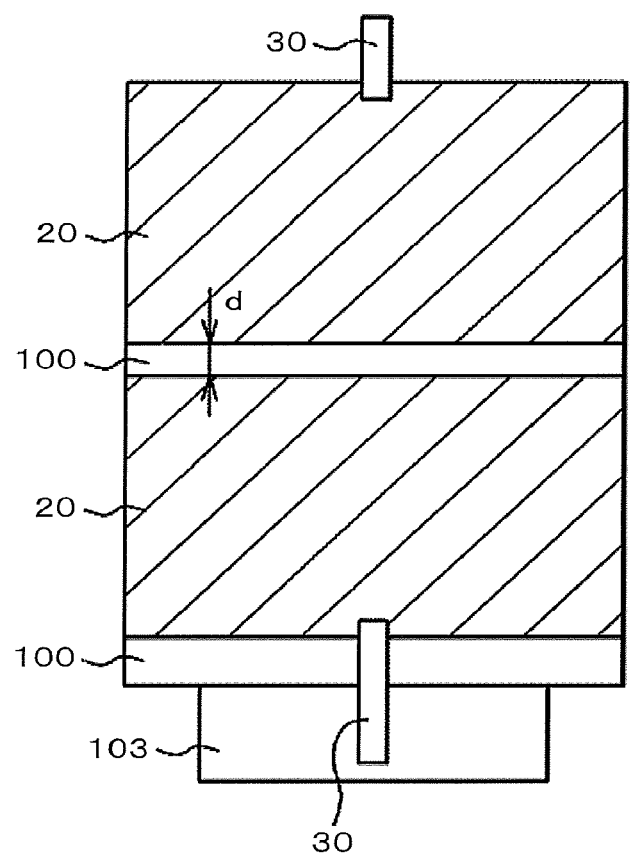
FIG. 25 is a plan view that shows an example of the configuration of the actuators of the fourth embodiment.
Figure 26:
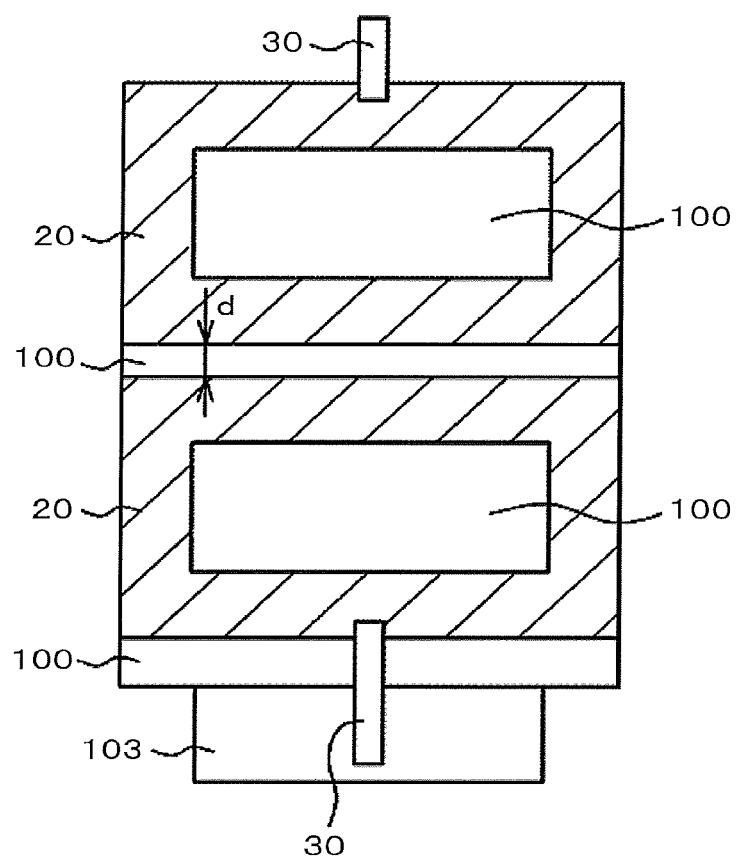
FIG. 26 is another plan view that shows an example of the configuration of the actuators of the fourth embodiment.
Figure 27:
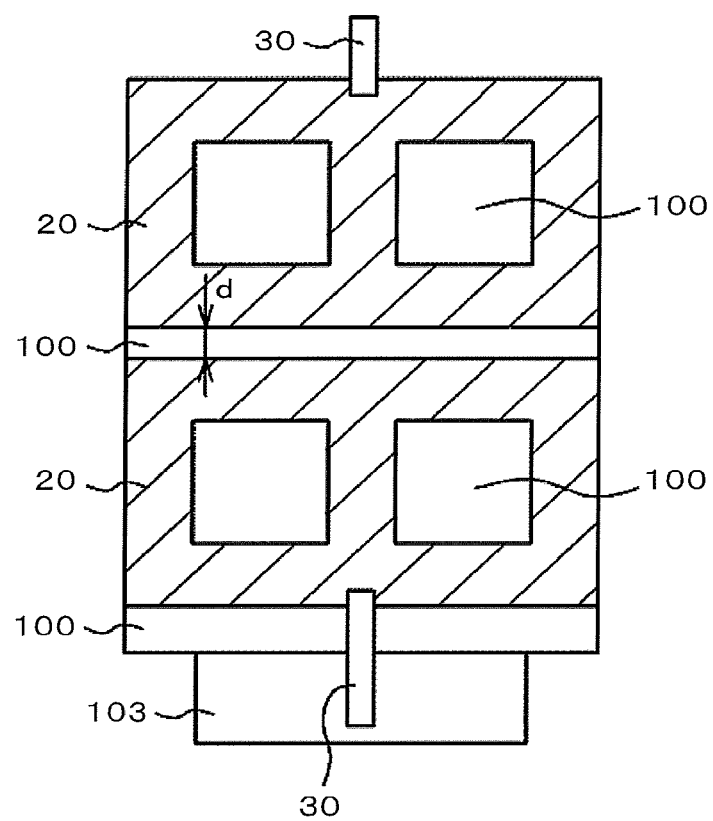
FIG. 27 is yet another plan view that shows an example of the configuration of the actuators of the fourth embodiment.

In this embodiment, too, various shapes of the actuators in a plan view can be applicable. FIG. 25 is a plan view that two actuator sets of solid planes are set in distance d on the display area. In FIGS. 25-27, the actuator set is represented by the second actuator 20 since the second actuator is seen in those figures. FIG. 26 is a plan view that each of the two actuator sets are formed frame like. FIG. 27 is a plan view that each of the two actuator sets has openings like windows. The shapes of the actuator sets are to be decided in considering the flexibility of the display device and the rigidity for operability of the touch sensor.

Fifth Embodiment

Figure 28:
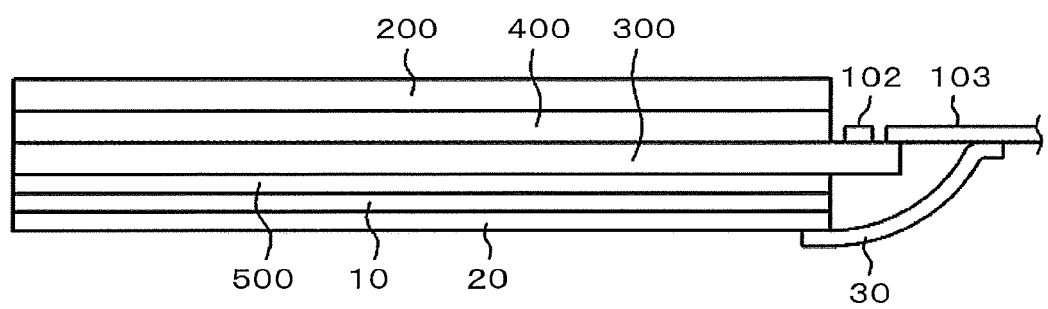
FIG. 28 is a cross sectional view of the liquid crystal display device according to the present invention.

FIG. 28 is a cross sectional view when the present invention is applied to the liquid crystal display device.

In FIG. 28, the TFT substrate 300, on which the TFTs and the pixel electrodes are formed, and the counter substrate 400 are set opposing to each other; the liquid crystal is sandwiched between the TFT substrate 300 and the counter substrate 400. The liquid crystal panel is formed by the TFT substrate 300 and the counter substrate 400. The area where the TFT substrate 300 and the counter substrate 400 do not overlap is the lower frame area, which the driver IC 102 is installed on and the flexible wiring substrate 103 is connected to. By the way, the upper polarizing plate and the lower polarizing plate exist outside of the TFT substrate 300 and the counter substrate 400; however, they are omitted in FIG. 28.

In FIG. 28, the touch sensor 200 is set on the counter substrate 400. The sheet shaped backlight 500 is adhered to the rear surface of the TFT substrate 300. The sheet shaped organic EL lighting can be used for the sheet shaped backlight 500, for example. The laminated actuator of the first actuator 10 and the second actuator 20 is attached to the rear surface of the sheet shaped back light 500.

In FIG. 28, the touch sensor 200 connects with the flexible wiring substrate 103; the input and output to the touch sensor 200 are made through the flexible wiring substrate 103. The flexible wiring substrate 103 supplies the driving voltage to the laminated body of the actuator 10, 20 through the conductive tape 30.

Normally, the liquid crystal display device is a flexible display device; however, when the touch sensor 200 is being operated the driving voltage is supplied to the actuators 10, 20 to give rigidity to the actuators 10, 20 consequently to the display device. Other structures or the functions are the same as explained in the embodiments 1-4.

FIG. 28 is an example of the transparent type liquid crystal display device; when the liquid crystal display device is reflection type, the back light 500 and the lower polarizing plate are not necessary. In this case, the structure below the TFT substrate 300 is the same as the display device of FIG. 3.

The present invention is applicable not only to the organic EL display device or the liquid crystal display device but also to other flexible displays as the quantum dot display device or the electronic paper.

What is claimed is:

1. A display device comprising:
a touch sensor and a display panel
wherein a laminated body of a first actuator and a second actuator is adhered to the rear surface of the display panel,
the first actuator has a first ion exchange resin sandwiched with a first conductive polymer film and a second conductive polymer film,
the second actuator has a second ion exchange resin sandwiched with a third conductive polymer film and a fourth conductive polymer film,
each of the first actuator and the second actuator has a frame and an opening inside the frame, the opening overlaps a display area of the display panel in a plan view,
the first actuator itself can bend when voltage is applied,
the second actuator itself can bend when voltage is applied, and
wherein a bending direction of the first actuator when voltage is applied and a bending direction of the second actuator when voltage is applied are opposite directions to each other.

2. The display device according to claim 1,
wherein the first actuator is set nearer to the display panel than the second actuator,
the first actuator tends to bend convex to the display panel when voltage is applied to the first actuator,
the second actuator tends to bend convex opposite to the display panel when voltage is applied to the second actuator.

3. The display device according to claim 1,
wherein the voltage is applied to the first actuator and the second actuator during an operation of the touch sensor.

4. The display device according to claim 1,
wherein after touching activity to the touch sensor is finished, an operating voltage is maintained to the first actuator and to the second actuator for a certain time.

5. The display device according to claim 4,
wherein the certain time can be set arbitrarily.

6. The display device according to claim 1,
wherein a first operating voltage for the first actuator and a second operating voltage for the second actuator can be set arbitrarily.

7. The display device according to claim 1,
wherein a first operating voltage for the first actuator and a second operating voltage for the second actuator can be set independently and arbitrarily to each other.

8. The display device according to claim 1,
wherein the touch sensor is built in the display panel.

9. The display device according to claim 1,
wherein the display panel is a flexible display panel.

10. The display device according to claim 1,
wherein the display panel is an organic EL display panel.

11. The display device according to claim 1,
wherein the display panel is a liquid crystal display panel.

12. A display device comprising:
a touch sensor and a display panel
wherein a laminated body of a first actuator and a second actuator is adhered to the rear surface of the display panel,
the first actuator has a first ion exchange resin sandwiched with a first conductive polymer film and a second conductive polymer film,
the first actuator is sandwiched with a first electrode and a second electrode,
the second actuator has a second ion exchange resin sandwiched with a third conductive polymer film and a fourth conductive polymer film,
the second actuator is sandwiched with a third electrode and a fourth electrode,
the first electrode adheres to the display panel,
the first actuator itself can bend when voltage is applied between the first electrode and the second electrode,
the second actuator itself can bend when voltage is applied between the third electrode and the fourth electrode,
wherein each of the first actuator and the second actuator has a frame and an opening inside the frame, and
the opening overlaps a display area of the display panel in a plan view, and
wherein a bending direction of the first actuator when voltage is applied and a bending direction of the second actuator when voltage is applied are opposite directions to each other.

13. The display device according to claim 12,
wherein either one of the first electrode, the second electrode, the third electrode and the fourth electrode is made of metal, the electrode made of the metal is covered by a protective film.

14. The display device according to claim 12,
wherein the second electrode and the third electrode are adhered to each other by a conductive adhesive.

15. The display device according to claim 12,
wherein either one of the first electrode, the second electrode, the third electrode and the fourth electrode is made of conductive resin.

16. The display device according to claim 12,
wherein the second electrode and the third electrode are the same entity.

17. The display device according to claim 1,
wherein at least two of the laminated bodies, each having a first actuator and a second actuator, are set with a certain distance to the rear surface of the display panel, in a plan view.

* * * * *